(12) United States Patent
Wang et al.

(10) Patent No.: US 10,536,137 B2
(45) Date of Patent: Jan. 14, 2020

(54) SHORT PULSE GENERATING CIRCUIT

(71) Applicant: AVISION INC., Hsinchu (TW)

(72) Inventors: Yu-Lang Wang, Hsinchu County (TW); Hsing-Lu Chen, Hsinchu (TW); Chun-Hung Pan, Hsinchu (TW)

(73) Assignee: AVISION INC., Hsinchu (TW)

( * ) Notice: Subject to any disclaimer, the term of this patent is extended or adjusted under 35 U.S.C. 154(b) by 0 days.

(21) Appl. No.: 16/279,382

(22) Filed: Feb. 19, 2019

(65) Prior Publication Data

US 2019/0326889 A1 Oct. 24, 2019

(30) Foreign Application Priority Data

Apr. 24, 2018 (TW) .............................. 107113924 A

(51) Int. Cl.
*H03K 3/037* (2006.01)
*H03K 5/13* (2014.01)

(52) U.S. Cl.
CPC .............. *H03K 5/13* (2013.01); *H03K 3/037* (2013.01)

(58) Field of Classification Search
CPC .................................. H03K 3/037; H03K 5/13
USPC .......................... 327/108, 109, 291, 385, 386
See application file for complete search history.

(56) References Cited

U.S. PATENT DOCUMENTS 4,307,301 A * 12/1981 Speidel .................... B60Q 1/38
  315/136
8,253,439 B2 * 8/2012 Gerding ............... H03K 3/0315
  326/104

FOREIGN PATENT DOCUMENTS

TW   200537802   11/2005
TW   201404031   1/2014

OTHER PUBLICATIONS

Taiwan Intellectual Property Office, Office Action dated Jan. 7, 2019.

* cited by examiner

*Primary Examiner* — William Hernandez
(74) *Attorney, Agent, or Firm* — WPAT, PC

(57) ABSTRACT

A short pulse generating circuit including a pulse generating circuit, an actuation control circuit and a delay control circuit is provided. The pulse generating circuit is electrically coupled to a switch, which is coupled to a power. When the power is turned on, the power causes the pulse generating circuit to generate a long pulse. The actuation control circuit is electrically coupled to the power and the pulse generating circuit. When the power is turned on, the actuation control circuit controls a voltage level of each output of the pulse generating circuit to a fixed value. The delay control circuit is electrically coupled to the pulse generating circuit. When the switch is turned on, the power controls the delay control circuit to change the voltage level of each output of the pulse generating circuit to generate a short pulse output.

10 Claims, 4 Drawing Sheets

150
SHORT PULSE GENERATING CIRCUIT

This application claims the benefit of Taiwan application Serial No. 107113924, filed Apr. 24, 2018, the subject matter of which is incorporated herein by reference.

BACKGROUND OF THE INVENTION

Field of the Invention

The invention relates in general to a short pulse generating circuit, and more particularly to a short pulse generating circuit used in a switch or a press key.

Description of the Related Art

In regard to the operation of an electronic device, how to shorten the response time and provide stable signals in response to the requirements of speed and operation environment is very essential to the industries. However, due to the features of press key, the conventional design of controlling pulse signals or voltages using press key is susceptible to problems such as signal jitter, bouncing malfunction and slow response.

Therefore, it has become a prominent task for the industries to provide a cost-down short pulse generating circuit capable of stabilizing the pressing activation of a press key or a switch.

SUMMARY OF THE INVENTION

To resolve the above problems, a short pulse generating circuit including a pulse generating circuit, an actuation control circuit and a delay control circuit is provided in an embodiment of the present invention. The pulse generating circuit is electrically coupled to a switch, which is coupled to a power. When the power is turned on, the power causes the pulse generating circuit to generate a long pulse. The actuation control circuit is electrically coupled to the power and the pulse generating circuit. When the power is turned on, the actuation control circuit controls a voltage level of each output of the pulse generating circuit to a fixed value. The delay control circuit is electrically coupled to the pulse generating circuit. When the switch is turned on, the power controls the delay control circuit to change the voltage level of each output of the pulse generating circuit to generate a short pulse output.

To summarize, the short pulse generating circuit of the present invention is provided for a controllable and stable functions having a prompt response and free of noises and can generate a short pulse signal through the use of simple and cheap circuit.

The above and other aspects of the invention will become better understood with regard to the following detailed description of the preferred but non-limiting embodiment(s). The following description is made with reference to the accompanying drawings.

DETAILED DESCRIPTION OF THE INVENTION

Detailed descriptions of the embodiments of the invention are made with reference to accompanying drawings. The embodiments are not for limiting the scope of protection of the invention. The descriptions of the structure and operations are not for limiting the order of execution, and any equivalent devices formed by the structures formed of different arrangements of the elements are within the scope of protection of the invention. Moreover, the dimension scales used in the accompanying drawings are not based on actual proportion of the product. Designations common to the accompanying drawings are used to indicate identical or similar elements.

Moreover, ordinal numbers, such as "the first", "the second", and etc., are used in the specification and claims to differentiate the elements or operations described using the same terminologies, not to designate specific sequence or order or limit the invention.

Figure 1A:
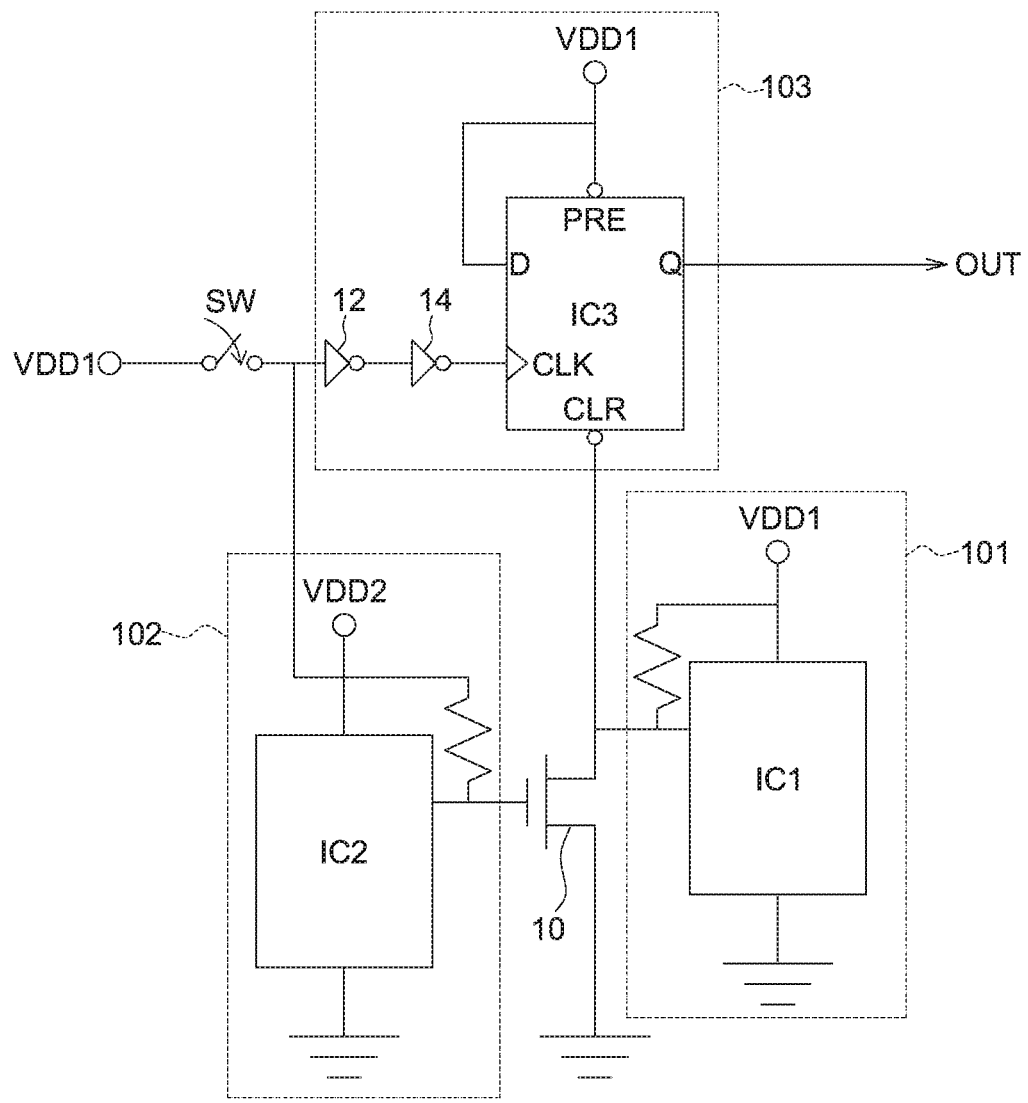
FIG. 1A is a schematic diagram of a short pulse generating circuit.
Figure 1B:
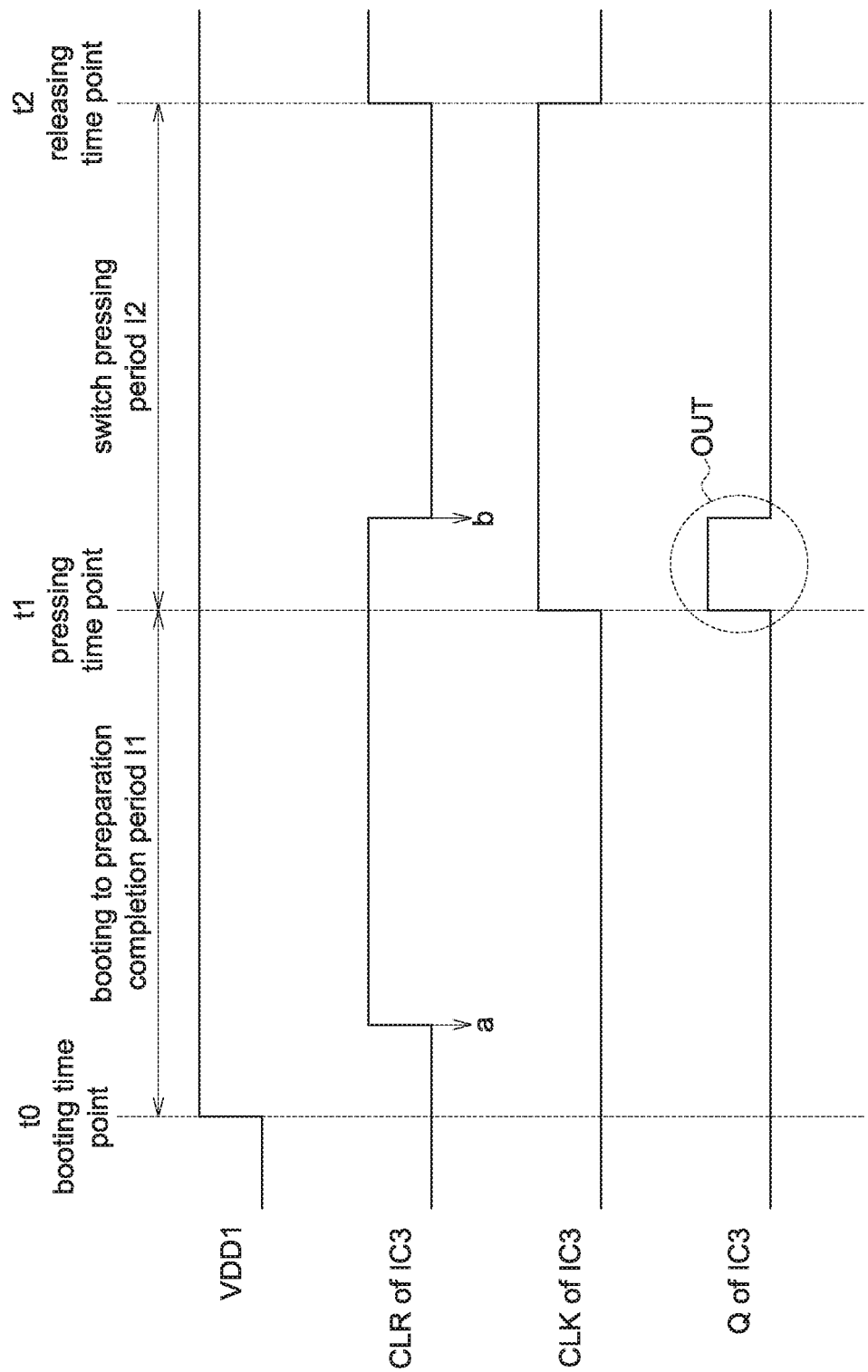
FIG. 1B is a timing diagram of a short pulse generating circuit.

Refer to FIGS. 1A-1B. FIG. 1A is a schematic diagram of a short pulse generating circuit 100. FIG. 1B is a timing diagram of a short pulse generating circuit. As indicated in FIG. 1A, the short pulse generating circuit 100 includes a pulse generating circuit 103, an actuation control circuit 101 and a delay control circuit 102. The pulse generating circuit 103 is electrically coupled to a switch SW, which is coupled to a power VDD1. When the power VDD1 is turned on, the power VDD1 causes the pulse generating circuit B1 to generate a long pulse. The actuation control circuit 101 is electrically coupled to the power VDD1 and the pulse generating circuit 103. When the power VDD1 is turned on, the actuation control circuit B2 controls a voltage level of each output of the pulse generating circuit 103 to a fixed value. The delay control circuit 102 is electrically coupled to the pulse generating circuit 103. When the switch SW is turned on, the power VDD1 controls the delay control circuit 102 to change the voltage level of each output of the pulse generating circuit 103 to generate a short pulse output OUT.

In an embodiment, as indicated in FIG. 1A, the pulse generating circuit 103 includes a D flip-flop IC3 and two NOT logic gates 12 and 14. The D flip-flop IC3 includes a data input end D, a data output end Q, a pulse control end CLK, a data erase end CLR and a preset control end PRE. Besides, the actuation control circuit 101 includes an actuation control module IC1, and the delay control circuit 102 includes a delay control module IC2. In an embodiment as indicated in FIG. 1B, the operating period of the short pulse generating circuit can be divided into a booting to preparation completion period I1 (the period from a booting time point t0 to a pressing time point t1) and a switch pressing period I2 (the period from the pressing time point t1 to a releasing time point t2).

Refer to FIGS. 1A-1B. At the booting time point t0, the power VDD1 is boosted. Here, "booting" refers to turning on the power of any machine. In the present example, at time point a, which is 27 milliseconds (ms) after the booting, the voltage of the actuation control module IC1 changes to a high level from a low level to boost the data erase end CLR of the D flip-flop IC3. At the pressing time point t1, the switch SW (such as a press key) is pressed. At time point b which is 27 milliseconds after the pressing time point t1, the voltage of the delay control module IC2 changes to a high level from a low level to buck the data erase end CLR of the D flip-flop IC3. On the other hand, at the pressing time point t1, the pulse control end CLK of the D flip-flop IC3 is boosted until the releasing time point t2 at which the pulse control end CLK is bucked. Thus, the data output end Q of the D flip-flop IC3 can obtain a short pulse output OUT which is fixed and free of noises. However, anyone who is skilled in the art will understand that the period of 27 milliseconds is merely an exemplification, and can also be set as 20 milliseconds, 25 milliseconds, 30 milliseconds or other number of seconds.

After the power VDD1 is turned on, the actuation control module IC1, being capable of adjusting delay, controls the voltage level of each output of the D flip-flop IC3 to a fixed value. When the switch SW is pressed (ON), the switch SW generates a long pulse, which can be larger than 150 milliseconds, and the edge of the boosted pulse triggers the D flip-flop IC3 to actuate and at the same time provides an operating power VDD1 to the delay control module IC2. After the delay control module IC2 is turned on, the delay control module IC2, being capable of adjusting delay, controls the D flip-flop IC3 and changes the voltage level of each output of the D flip-flop IC3 to a short pulse. Besides, when the press key bounces back (OFF), the actuation of other circuits will not affect the output of the D flip-flop IC3. Meanwhile, the system resumes the initial preparation state. Through the use of the actuation control module IC1 and the delay control module IC2, the short pulse generating circuit 100 can precisely control the delay time (pulse width) to achieve a short pulse output which is adjustable and fixed. The duration of the short pulse output can be smaller than 40 milliseconds.

Figure 2A:
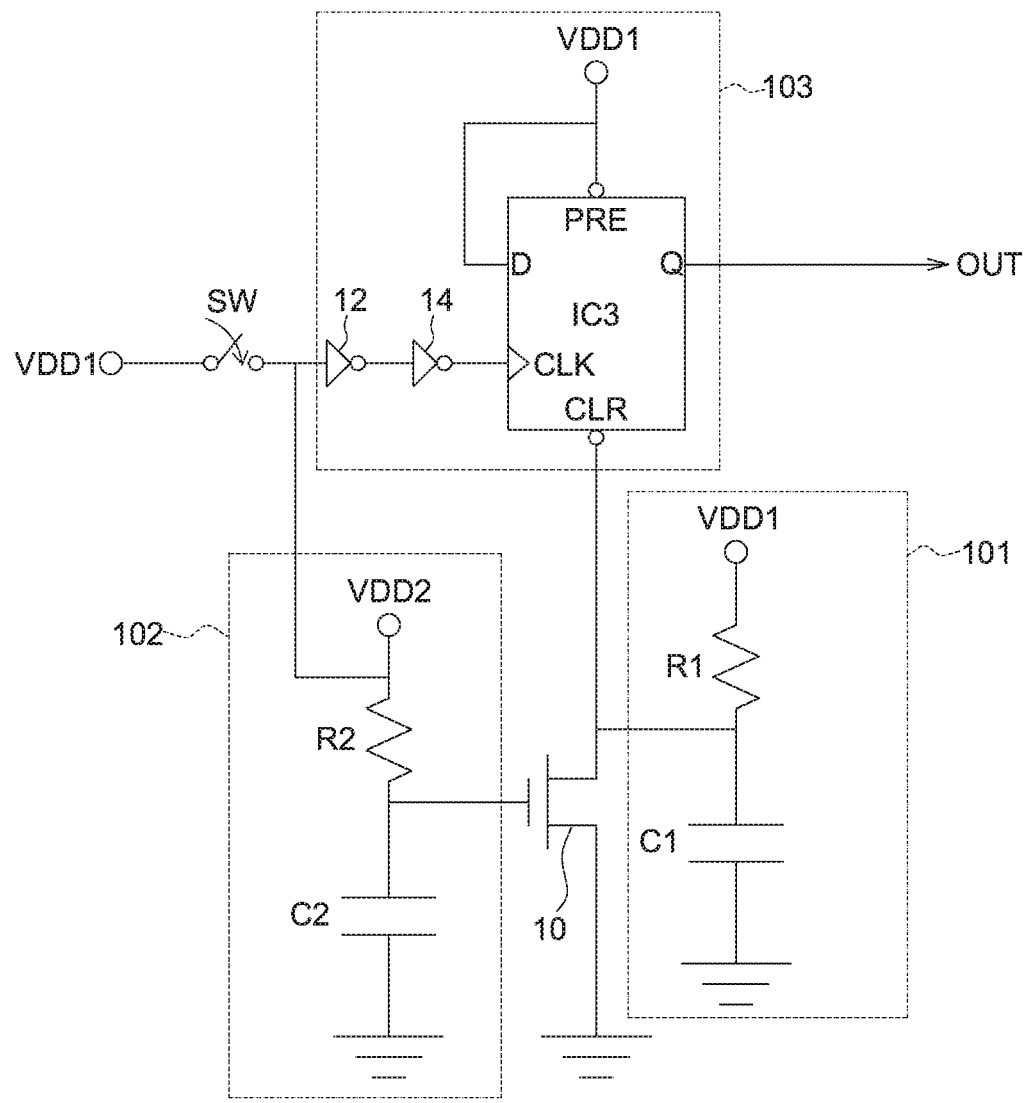
FIG. 2A is a schematic diagram of a short pulse generating circuit.
Figure 2B:
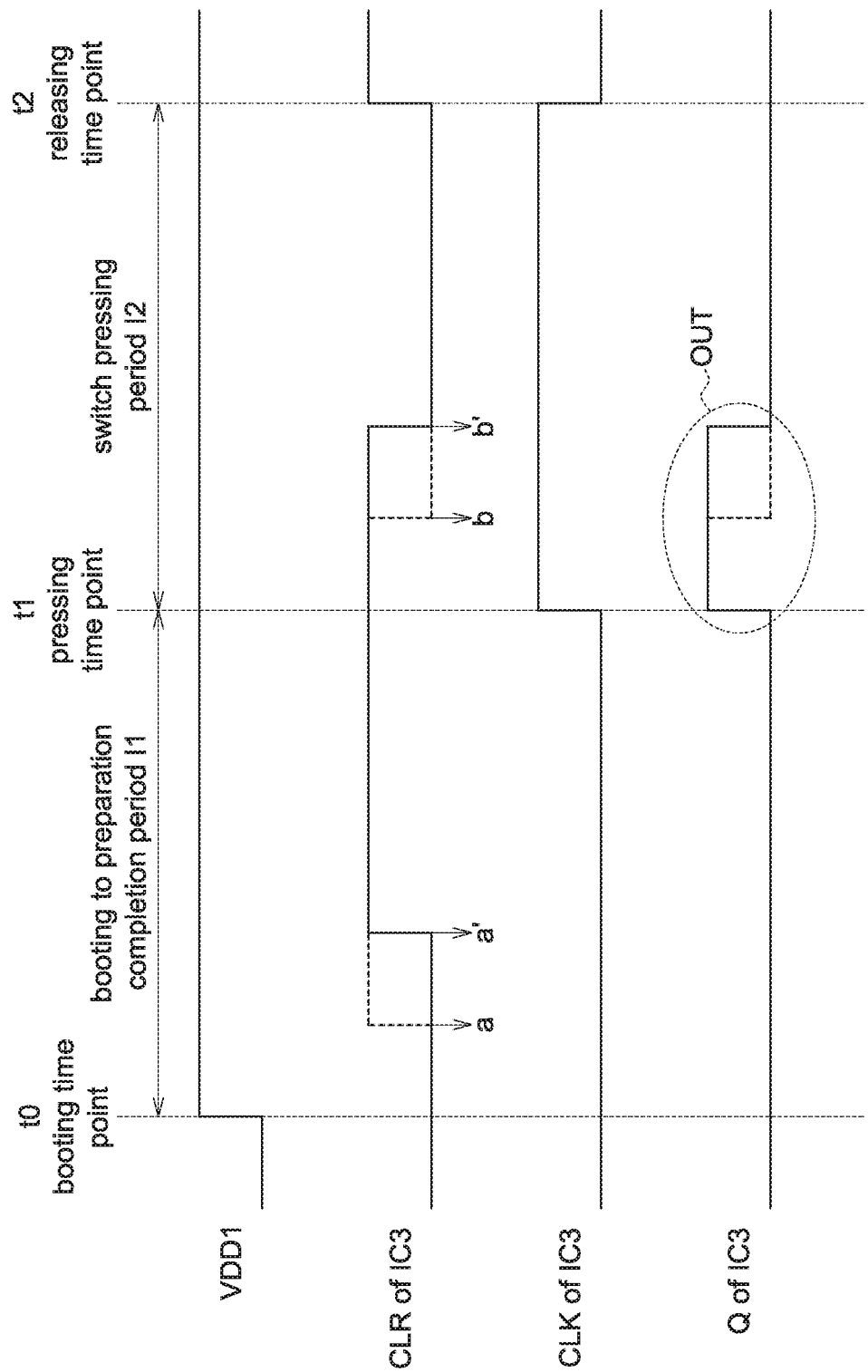
FIG. 2B is a timing diagram of a short pulse generating circuit.

Refer to FIGS. 2A-2B. FIG. 2A is a schematic diagram of a short pulse generating circuit 200. FIG. 2B is a timing diagram of a short pulse generating circuit. FIG. 2A is different from FIG. 1A in that: the actuation control circuit 101 of FIG. 2A includes a first resistor R1 and a first capacitor C1, the data erase end CLR is electrically coupled to the first resistor R1 and the first capacitor C1 both disposed in the actuation control circuit 101. After the power VDD1 is turned on, the first resistor R1 and the first capacitor C1 perform charging and cause the voltage level of each output of the pulse generating circuit 103 to a fixed value. Therefore, the first resistor R1 and the first capacitor C1 can control the charging time and actuation during the booting to stabilize the system.

Moreover, the data erase end CLR is electrically coupled to a second resistor R2 and a second capacitor C2 both disposed in the delay control circuit 102. When the switch SW is turned on, the power VDD1 is provided to the delay control circuit 102, and causes the delay control circuit 102 to adjust the charging time of the second resistor R2 and the second capacitor C2 and the discharging time of the first resistor R1 and the first capacitor C1 to generate a short pulse output OUT. In an embodiment, when the switch SW is not turned on, a power VDD2 is provided to the delay control circuit 102.

In an embodiment, the charging time of the second resistor R2 and the second capacitor C2 determines the duration of the short pulse output OUT.

In an embodiment, the delay control circuit 102 adjusts the charging time of the second resistor R2 and the second capacitor C2 and the discharging time of the first resistor R1 and the first capacitor C1 through a transistor 10.

Refer to FIG. 2B. At the booting time point t0, the power VDD1 is boosted. Here, "booting" refers to the power capable of activating any machine. In the present example, during the period from the time point "a" following the booting time point t0 to a time point a', the first resistor R1 and the first capacitor C1 are charged to a high level, such that the data erase end CLR of the D flip-flop IC3 is boosted. At the pressing time point t1, the switch SW (such as a press key) is pressed. Then, during the period from the time point "b" following the pressing time point t1 to the time point b', the second resistor R2 and the second capacitor C2 are charged to a high level, and the first resistor R1 and the first capacitor C1 are discharged to a low level, such that the data erase end CLR of the D flip-flop IC3 is bucked. On the other hand, at the pressing time point t1, the pulse control end CLK of the D flip-flop IC3 is boosted until the releasing time point t2 at which the pulse control end CLK is bucked. Therefore, the data output end Q of the D flip-flop IC3 can obtain a short pulse output OUT which is non-fixed and free of noises.

According to the above disclosure, after the power VDD1 is turned on, due to the charging delay feature of the first resistor R1 and the first power C1, the voltage level of each output of the D flip-flop IC3 is a fixed value. When the switch SW is pressed (ON), a long pulse is generated. The long pulse can be larger than 150 milliseconds. The edge of the boosted pulse triggers the D flip-flop IC3 to actuate and at the same time provides an operating power to the second resistor R2 and the second capacitor C2. After the second resistor R2 and the second capacitor C2 are turned on, the D flip-flop IC3 can be controlled according to the charging time of the second resistor R2 and the second capacitor C2 and the discharging time of the first resistor R1 and the first capacitor C1, such that the voltage level of each output of the D flip-flop IC3 changes to a short pulse output. When the press key bounces back (OFF), the actuation of other circuits will not affect the output of the D flip-flop IC3. Meanwhile, the system resumes the initial preparation state. When the delay time is controlled according to the charging time of the second resistor R2 and the second capacitor C2 and the discharging time of the first resistor R1 and the first capacitor C1, the delay time (pulse width) is not fixed (the delay time is dependent on the tolerance of the second resistor R2, the second capacitor C2 and the first resistor R1 and the first capacitor C1), but still can shorten the duration of the short pulse output.

To summarize, the short pulse generating circuit of the present invention is provided for a controllable and stable functions having a prompt response and free of noises and can generate a short pulse signal through the use of simple and cheap circuit.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A short pulse generating circuit, comprising:
a pulse generating circuit electrically coupled to a switch, wherein the switch is coupled to a power, and when the power is turned on, the power causes the pulse generating circuit to generate a long pulse;
an actuation control circuit electrically coupled to the power and the pulse generating circuit, wherein when the power is turned on, the actuation control circuit controls a voltage level of an output of the pulse generating circuit to a fixed value; and a delay control circuit electrically coupled to the pulse generating circuit, wherein when the switch is turned on, the power controls the delay control circuit to change the voltage level of the output of the pulse generating circuit to generate a short pulse output.

2. The short pulse generating circuit according to claim 1, wherein the pulse generating circuit comprises a D flip-flop, which comprises a data input end, a data output end, a pulse control end, a data erase end and a preset control end.

3. The short pulse generating circuit according to claim 2, wherein the data erase end is electrically coupled to a first resistor and a first capacitor both disposed in the actuation control circuit, and after the power is turned on, the first resistor and the first capacitor perform charging and cause the voltage level of the output of the pulse generating circuit to be charged to the fixed value due to a constant charging time of the first resistor and the first capacitor.

4. The short pulse generating circuit according to claim 2, wherein the data erase end is electrically coupled to a second resistor and a second capacitor both disposed in the delay control circuit through a transistor, and when the switch is turned on, the power controls the delay control circuit to adjust a charging time of the second resistor and the second capacitor and a discharging time of a first resistor and a first capacitor both disposed in the actuation control circuit through the transistor to generate the short pulse output.

5. The short pulse generating circuit according to claim 4, wherein the delay control circuit adjusts the charging time of the second resistor and the second capacitor and the discharging time of the first resistor and the first capacitor through a transistor.

6. The short pulse generating circuit according to claim 4, wherein the charging time of the second resistor and the second capacitor determines a duration of the short pulse output.

7. The short pulse generating circuit according to claim 1, wherein a duration of the long pulse is larger than 150 milliseconds.

8. The short pulse generating circuit according to claim 1, wherein a duration of the short pulse output is smaller than 40 milliseconds.

9. The short pulse generating circuit according to claim 1, wherein when the switch is turned on, the power is provided to the delay control circuit.

10. The short pulse generating circuit according to claim 1, wherein the switch is a press key.

* * * * *